(12) United States Patent
Ke (10) Patent No.: US 11,456,431 B2
(45) Date of Patent: Sep. 27, 2022

(54) OLED DISPLAY PANEL AND OLED DISPLAY DEVICE EACH HAVING BARRIER LAYER BETWEEN FIRST AND SECOND FLEXIBLE LAYERS OF SUBSTRATE

(71) Applicant: WUHAN CHINA STAR OPTOELECTRONICS SEMICONDUCTOR DISPLAY TECHNOLOGY CO., LTD., Hubei (CN)

(72) Inventor: Linbo Ke, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 323 days.

(21) Appl. No.: 16/754,320

(22) PCT Filed: Jan. 9, 2020

(86) PCT No.: PCT/CN2020/071056
§ 371 (c)(1),
(2) Date: Apr. 7, 2020

(87) PCT Pub. No.: WO2021/031520
PCT Pub. Date: Feb. 25, 2021

(65) Prior Publication Data
US 2021/0408408 A1    Dec. 30, 2021

(30) Foreign Application Priority Data
Aug. 16, 2019 (CN) .......................... 201910759925.7

(51) Int. Cl.
*H01L 51/00* (2006.01)
*H01L 27/32* (2006.01)
(Continued)

(52) U.S. Cl.
CPC .......... *H01L 51/0097* (2013.01); *B32B 27/08* (2013.01); *B32B 27/281* (2013.01);
(Continued)

(58) Field of Classification Search
CPC ............. H01L 51/0097; H01L 27/3244; H01L 51/003; B32B 27/08; B32B 27/281
See application file for complete search history.

(56) References Cited

U.S. PATENT DOCUMENTS

2011/0139747 A1* 6/2011 Lee ..................... H01L 51/5253
427/407.1
2017/0294609 A1* 10/2017 Namkung .......... H01L 51/5253
(Continued)

FOREIGN PATENT DOCUMENTS

CN    107424519 A    12/2017
CN    107680994 A    2/2018
(Continued)

*Primary Examiner* — Michael Jung (57) ABSTRACT

The present disclosure provides an organic light-emitting diode (OLED) display panel and an OLED display device. The OLED display panel including a substrate disposed of a first flexible layer, a first barrier layer, and a second flexible layer sequentially. So that the water and oxygen be blocked by the first barrier layer after passing through the first flexible layer, and be blocked by the second barrier layer after passing through the second flexible layer. Therefore, improving the water and oxygen blocking ability of the OLED display panel to solve a technical problem of poor water and oxygen blocking abilities.

13 Claims, 3 Drawing Sheets

(51) Int. Cl.
  *B32B 27/08* (2006.01)
  *B32B 27/28* (2006.01)
  *H01L 51/52* (2006.01)
  *H01L 51/56* (2006.01)

(52) U.S. Cl.
  CPC ........ *H01L 27/3244* (2013.01); *H01L 51/003* (2013.01); *H01L 51/5253* (2013.01); *H01L 51/56* (2013.01); *B32B 2255/10* (2013.01); *B32B 2255/20* (2013.01); *B32B 2457/206* (2013.01); *H01L 2227/326* (2013.01); *H01L 2251/5338* (2013.01)

(56) References Cited

U.S. PATENT DOCUMENTS

| | | | |
|---|---|---|---|
| 2018/0175323 A1* | 6/2018 | Ahn | ........................ H01L 51/56 |
| 2019/0081129 A1* | 3/2019 | Sung | .................... H01L 27/3279 |
| 2020/0006685 A1 | 1/2020 | Xie | |
| 2020/0067001 A1 | 2/2020 | Dong et al. | |
| 2021/0234122 A1* | 7/2021 | Choi | .................... H01L 51/0096 |

FOREIGN PATENT DOCUMENTS

| | | | |
|---|---|---|---|
| CN | 108899346 A | 11/2018 | |
| CN | 109087999 A | 12/2018 | |
| CN | 208240682 U | 12/2018 | |
| CN | 109273505 A | 1/2019 | |
| CN | 109390499 A | 2/2019 | |
| CN | 110085740 A | 8/2019 | |
| CN | 110473964 A | 11/2019 | |
| JP | 2011175797 A | 9/2011 | |

* cited by examiner

OLED DISPLAY PANEL AND OLED DISPLAY DEVICE EACH HAVING BARRIER LAYER BETWEEN FIRST AND SECOND FLEXIBLE LAYERS OF SUBSTRATE

CROSS-REFERENCE TO RELATED APPLICATIONS

The present disclosure claims priority from a Chinese patent application filed with the Chinese Patent Office on Aug. 16, 2019, with application number 201910759925.7, titled "OLED display panel", the entire contents of which are incorporated herein by reference.

FIELD OF INVENTION

The present disclosure relates to the field of display technologies, and more particularly, to an OLED display panel and an OLED display device.

BACKGROUND OF INVENTION

Currently, organic light-emitting diode (OLED) display panels use polyimide as a flexible substrate to achieve the flexibility of the display panel, but polyimide has poor water and oxygen blocking abilities, which causes water and oxygen to intrude luminescent materials and reduce the life of OLED display panels.

Therefore, the currently OLED display panel has a technical problem of poor water and oxygen blocking abilities.

SUMMARY OF INVENTION

The present disclosure provides an OLED display panel and an OLED display device, which are used to solve a technical problem of the currently OLED display panel which has poor ability to block water and oxygen.

To solve the above problems, the technical solutions provided in the present disclosure are as follows:

One embodiment of the present disclosure provides an OLED display panel, including:

a substrate;
a second barrier layer disposed on the substrate;
a driving circuit layer disposed on the second barrier layer;
a light-emitting functional layer disposed on the driving circuit layer; and
an encapsulation layer disposed on the light-emitting functional layer;
wherein the substrate includes a first flexible layer, a first barrier layer, and a second flexible layer, the first barrier layer disposed on the first flexible layer, the second flexible layer disposed on the first barrier layer.

In one OLED display panel provided in the present disclosure, a material of the first flexible layer is the same as a material of the second flexible layer.

In one OLED display panel provided in the present disclosure, a material of the first flexible layer is different from a material of the second flexible layer.

In one OLED display panel provided in the present disclosure, a thickness of the second flexible layer is less than a thickness of the first flexible layer.

In one OLED display panel provided in the present disclosure, the thickness of the first flexible layer is greater than or equal to 8 micrometers, and the thickness of the second flexible layer is less than 8 micrometers.

In one OLED display panel provided in the present disclosure, the thickness of the first flexible layer is less than 8 micrometers, and the thickness of the second flexible layer is less than 8 micrometers.

In one OLED display panel provided in the present disclosure, a thickness of the second flexible layer is greater than a thickness of the first flexible layer.

In one OLED display panel provided in the present disclosure, the thickness of the first flexible layer is less than 8 micrometers, and the thickness of the second flexible layer is greater than or equal to 8 micrometers.

In one OLED display panel provide the present disclosure, a material of the first flexible layer includes a polyimide.

In one OLED display panel provided in the present disclosure, a material of the first barrier layer is the same as a material of the second barrier layer.

In one OLED display panel provided in the present disclosure, the material of the first barrier layer includes at least one of a silicon nitride and a silicon oxide.

In one OLED display panel provided in the present disclosure, a material of the first barrier layer is different from a material of the second barrier layer.

In one OLED display panel provided in the present disclosure, the first barrier layer is provided with a groove, and the second flexible layer is filled into the groove.

In one OLED display panel provided in the present disclosure, a thickness of the first barrier layer is less than a thickness of the first flexible layer, and the thickness of the first barrier layer is less than a thickness of the second flexible layer.

In one OLED display panel provided in the present disclosure, a thickness of the second barrier layer is less than a thickness of the first flexible layer, and the thickness of the second barrier layer is less than a thickness of the second flexible layer.

Meanwhile, the present disclosure provides an organic light-emitting diode (OLED) display device including an OLED display panel, wherein the OLED display panel includes:

a substrate;
a second barrier layer disposed on the substrate;
a driving circuit layer disposed on the second barrier layer;
a light-emitting functional layer disposed on the driving circuit layer; and
an encapsulation layer disposed on the light-emitting functional layer;
wherein the substrate includes a first flexible layer, a first barrier layer, and a second flexible layer, the first barrier layer disposed on the first flexible layer, the second flexible layer disposed on the first barrier layer.

In one OLED display device provided in the present disclosure, a material of the first flexible layer is the same as a material of the second flexible layer.

In one OLED display device provided in the present disclosure, a material of the first flexible layer is different from a material of the second flexible layer.

In one OLED display device provided in the present disclosure, a thickness of the second flexible layer is less than a thickness of the first flexible layer.

In one OLED display device provided in the present disclosure, a material of the first barrier layer is the same as a material of the second barrier layer.

The present disclosure provides an organic light emitting diode (OLED) display panel and an OLED display device. The OLED display panel including a substrate; a second barrier layer disposed on the substrate; a driving circuit layer disposed on the second barrier layer; a light-emitting function layer disposed on the driving circuit layer; and an encapsulation layer disposed on the light-emitting function layer; wherein the substrate includes a first flexible layer, a first barrier layer, and a second flexible layer, the first barrier layer disposed on the first flexible layer, the second flexible layer disposed on the first barrier layer. By disposing the substrate includes the first flexible layer, the first barrier layer, and the second flexible layer sequentially, the water and oxygen be blocked by the first barrier layer after passing through the first flexible layer, and be blocked by the second barrier layer after passing through, the second flexible layer. Therefore, improving the water and oxygen blocking ability of the OLED display panel to solve a technical problem of poor water and oxygen blocking abilities.

DETAILED DESCRIPTION OF PREFERRED EMBODIMENTS

The present disclosure provides an OLED display panel and an OLED display device. In order to make the purpose, technical solution, and effect of the present disclosure clearer and more specific, the present disclosure is described in detail below with reference to the accompanying figures and embodiments. It should be understood the specific embodiments described herein are only used to explain and not used to limit the present disclosure.

The present disclosure is directed to a technical problem of the poor ability to block water and oxygen of existing OLED display panel, and the embodiments of the present disclosure are used to solve the technical problem.

Figure 1:
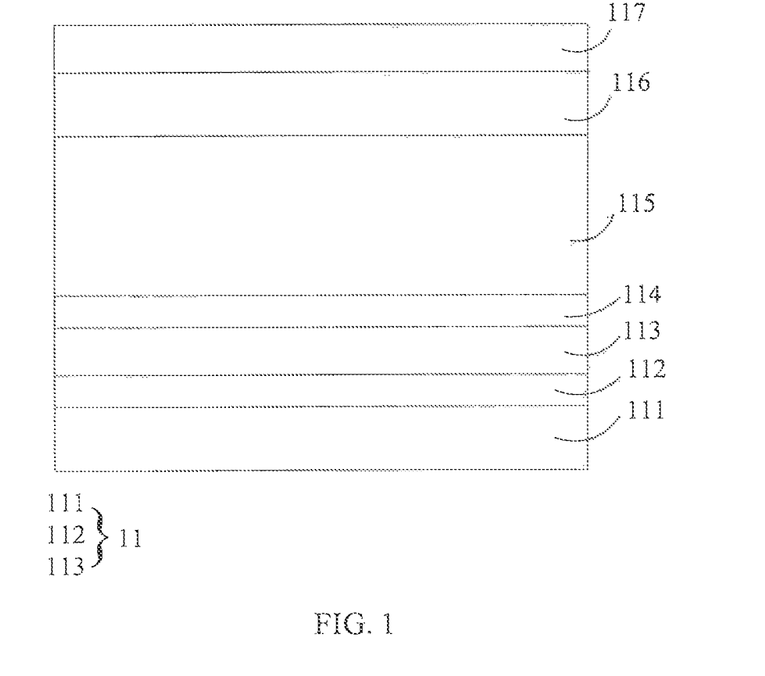
FIG. 1 is a first schematic diagram of an OLED display panel according to one embodiment of the present disclosure.

As shown in FIG. 1, one embodiment of the present disclosure provides an OLED display panel, including:

a substrate 11;

a second barrier layer 114 disposed on the substrate 11;

a driving circuit layer 115 disposed on the second barrier layer 114;

a light-emitting functional layer 116 disposed on the driving circuit layer 115; and an encapsulation layer 117 disposed on the light-emitting functional layer 116;

wherein the substrate 11 includes a first flexible layer 111, a first barrier layer 112, and a second flexible layer 113, the first barrier layer 112 disposed on the first flexible layer 11, the second flexible layer 113 disposed on the first barrier layer 112.

One embodiment of the present disclosure provides an OLED display panel. The OLED display panel including a substrate; a second barrier layer disposed on the substrate; a driving circuit layer disposed on the second barrier layer; a light-emitting function layer disposed on the driving circuit layer; and an encapsulation layer disposed on the light-emitting function layer; wherein the substrate includes a first flexible layer, a first barrier layer, and a second flexible layer, the first barrier layer disposed on the first flexible layer, the second flexible layer disposed on the first barrier layer. By disposing the substrate includes the first flexible layer, the first barrier layer, and the second flexible layer sequentially, the water and oxygen be blocked by the first barrier layer after passing through the first flexible layer, and be blocked by the second barrier layer after passing through the second flexible layer. Therefore, improving the water and oxygen blocking ability of the OLED display panel to solve a technical problem of poor water and oxygen blocking abilities.

In one embodiment, a material of the first flexible layer is the same as a material of the second flexible layer, therefore, no other flexibility material required when manufacturing the first flexible layer and the second flexible layer, so that while achieving flexibility and ability to blocking water and oxygen, the second flexible layer can be manufactured by the same process as the first flexible layer, thereby achieving relatively simple and lower cost of the manufacturing process.

In one embodiment, a material of the first flexible layer is different from a material of the second flexible layer, by using different materials of the flexible layers, achieving the flexibility of the display panel, and improving the ability to block water and oxygen by the second flexible layer.

In one embodiment, a thickness of the second flexible layer is less than a thickness of the first flexible layer. Considering the ability to block water and oxygen, it is necessary to improve the flexibility of the display panel at the same time, to avoid the display of the panel display affected by metal line fracture of a driving circuit layer. By disposing of the thickness of the second flexible layer less than the thickness of the first flexible layer, achieving a stress-neutral layer is closer to the driving circuit layer, avoiding to the metal line fracture of the driving circuit layer and affects the display.

In one embodiment, a thickness of the second flexible layer is equal to a thickness of the first flexible layer.

In one embodiment, a thickness of the first flexible layer is greater than or equal to 8 micrometers, and a thickness of the second flexible layer is less than 8 micrometers. In practical manufacturing process, the bending radius of the display panel is 0.3 millimeters, when the thickness of the first flexible layer and the second flexible layer are both greater than 8 micrometers, the stress of the metal lines layer is 2439 megapascals. By disposing the thickness of the first flexible layer greater than or equal to 8 micrometers, and the thickness of the second flexible layer less than 8 micrometers, the stress of the metal line layer is 1905 megapascals (MPa), thereby reducing the stress on the metal line, and reducing the risk of metal line fracture.

In one embodiment, the thickness of the first flexible layer is less than 8 micrometers, and the thickness of the second flexible layer is less than 8 micrometers; by further reducing the thickness of the first flexible layer, so that under the same conditions, the metal lines layer has a stress of 1512 MPa, which further reduces the stress on the metal line.

In the embodiments of the present disclosure, after testing, it can be known that when the thickness of the first flexible layer and the second flexible layer are both greater than 8 micrometers, the stress of the metal lines layer is 2439 MPa, when the thickness of the first flexible layer is greater than 8 micrometers and the thickness of the second flexible layer is less than 8 micrometers, the stress of the metal lines layer is 1905 MPa, when the thickness of the first flexible layer and the second flexible layer are less than 8 micrometers, the stress of the metal lines layer is 1512 MPa; that is, by reducing the thickness of the first flexible layer and the second flexible layer, the stress of the metal lines layer can be reduced, thereby improving the flexibility of the display panel, and when the thickness of the first flexible layer and the second flexible layer are less than 8 micrometers, the display panel has a best flexibility.

In one embodiment, the thickness of the second flexible layer is greater than the thickness of the first flexible layer. In order to form the second barrier layer better on the second flexible layer, the thickness of the second flexible layer can be greater than the thickness of the first flexible layer.

In one embodiment, the thickness of the first flexible layer is less than 8 micrometers, and the thickness of the second flexible layer is greater than 8 micrometers, when reduce the stress on the metal line, the thickness of the first flexible layer can be less than 8 micrometers, the thickness of the second flexible layer can be greater than or equal to 8 micrometers, thereby reducing the thickness of the first flexible layer and the second flexible layer as a whole while reducing stress on the metal line.

In one embodiment, a material of the first flexible layer includes a polyimide, but is not limited thereto. The material of the first flexible layer may be a flexible polymer material with better light transmittance.

In one embodiment, a material of the second flexible layer includes a polyimide, but is not limited thereto. The material of the second flexible layer may be a flexible polymer material with better light transmittance.

Figure 2:
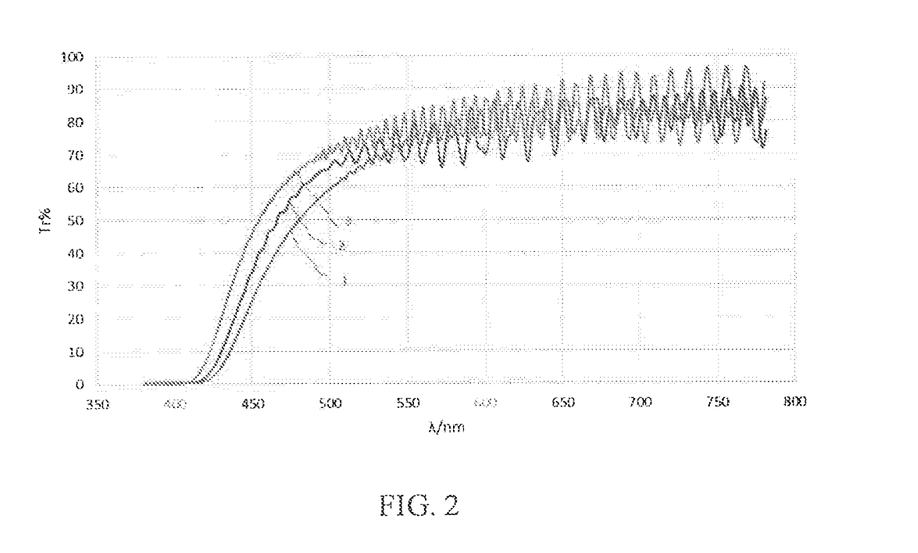
FIG. 2 is a graph of thickness and light transmittance of the OLED display panel according to one embodiment of the present disclosure.

As shown in FIG. 2, one embodiment of the present disclosure provides a graph of the thickness and light transmittance of the OLED display panel. In FIG. 2, an abscissa is a wavelength λ of light transmitted through the OLED display panel, and a unit of the abscissa is nanometer (nm), an ordinate is a light transmittance Tr of the light transmitted through the OLED display panel, a unit of the light transmittance Tr is %. Curve 1 in FIG. 2 is a relationship between the wavelength of light and the optical transmittance when the thickness of the first flexible layer and the second flexible layer are both greater than or equal to 8 micrometers. Curve 2 in FIG. 2 is a relationship between the wavelength of light and the optical transmittance the thickness of the first flexible layer and the second flexible layer when the thickness of one of the first flexible layer and the second flexible layer is greater than or equal to 8 micrometers, and the thickness of another one is less than 8 micrometers. Curve 3 in FIG. 2 is a relationship between the wavelength of light and the optical transmittance when the thickness of the first flexible layer and the second flexible layer are less than 8 micrometers.

It can be known from FIG. 2 that as the thicknesses of the first flexible layer and the second flexible layer decreases, light transmittances of a light passing through the OLED display panel increases, and when wavelength of the light is in the range from 400 nm to 500 nm, as the thicknesses of the first flexible layer and the second flexible layer decreases, the light transmittance increases greatly, when the wavelength of the light is in a range from 500 nm to 800 nm, as the thicknesses of the first flexible layer and the second flexible layer decreases, the light transmittance increases, and when the thicknesses of the first flexible layer and second flexible layer are both less than 8 micrometers, the OLED display panel can obtain a highest light transmittance.

It can be known from the above analysis that when the thicknesses of the first flexible layer and the second flexible layer are both greater than 8 micrometers, a larger barrier appears when the light passes through the OLED display panel. As the thicknesses of the first flexible layer and the second flexible layer reduced, the light transmittance is increased. When the thickness of the first flexible layer and the second flexible layer are both less than 8 micrometers, the light transmittance is greatest, that is, when the thickness of the first flexible layer and the second flexible layer decreases, the light transmittance of the display panel increases, and when the thickness of the first flexible layer and the second flexible layer are both less than 8 micrometers, the display pane can obtain a greatest light transmittance.

In this embodiment of the present disclosure, by reducing the thickness of the first flexible layer or the second flexible layer, or reducing the thickness of the first flexible layer and the second flexible layer at the same time, can reduce the stress to the metal line of the driving circuit layer and also improve the light transmittance. Compared with when the thickness of the first flexible layer and the second flexible layer are greater than 8 micrometers, the average transmittance of light from the display panel is 61%, and the transmittance of light with a wavelength of 450 nm is 25.5%, Therefore, when the thickness of one of the first flexible layer and the second flexible layer is greater than or equal to 8 micrometers, and the thickness of another one layer is less than 8 micrometers, the average light transmittance of the display panel is 63%, and transmittance of light with a wavelength of 450 nm is 33.2%. Further, when the thickness of the first flexible layer and the second flexible layer are less than 8 micrometers, the average light transmittance of the display panel is 66%, and the transmittance of light with a wavelength of 450 nm is 45.7%. According to the above data, it can be known the embodiments of the present disclosure can improve the flexibility while reducing the risk of metal line fracture, and also improve the light transmittance of the OLED display panel.

In one embodiment, a material of the first barrier layer is the same as a material of the second barrier layer, so that when water and oxygen invade the OLED display panel, water and oxygen are blocked by the first barrier layer after passing through the first flexible layer, and are blocked by the second barrier layer after passing through the second flexible layer. By blocking water and oxygen twice by the first barrier layer and the second barrier layer, water and oxygen are prevented from invading the driving circuit layer and the light-emitting function layer, thereby preventing the OLED display panel from reducing life.

In one embodiment, a material of the first barrier layer includes at least one of a silicon nitride and a silicon oxide. By using the silicon nitride and the silicon oxide to manufacture the first barrier layer, so that water and oxygen passed through the first barrier layer are blocked, thereby preventing water and oxygen from invading the driving circuit layer and the light-emitting functional layer, and improving the ability of the OLED display panel to block water and oxygen.

In one embodiment, a material of the first barrier layer is different from a material of the second barrier layer. By manufacturing the first barrier layer and the second barrier layer by different material, so that the first barrier layer and the second barrier layer can select different materials according requirements. For example, the first barrier layer is made of a material better to block water and oxygen, and the second barrier layer is made of a material with a lower cost to reduce the cost while achieving the ability to block water and oxygen.

In one embodiment, a thickness of the first barrier layer is less than a thickness of the first flexible layer, and a thickness of the first barrier layer is less than a thickness of the second flexible layer, by disposing of the thickness of the first barrier layer less than the thickness of the first flexible layer and the second flexible layer, so that the first barrier layer will not affect a flexibility of the display panel as much as possible, thereby improving the flexibility of the display panel, and reducing a risk of metal line fracture of the driving circuit layer.

In one embodiment, a thickness of the first flexible layer is 8 micrometers, a thickness of the second flexible layer is 7 micrometers, and a thickness of the first barrier layer is 6 micrometers.

Figure 3:
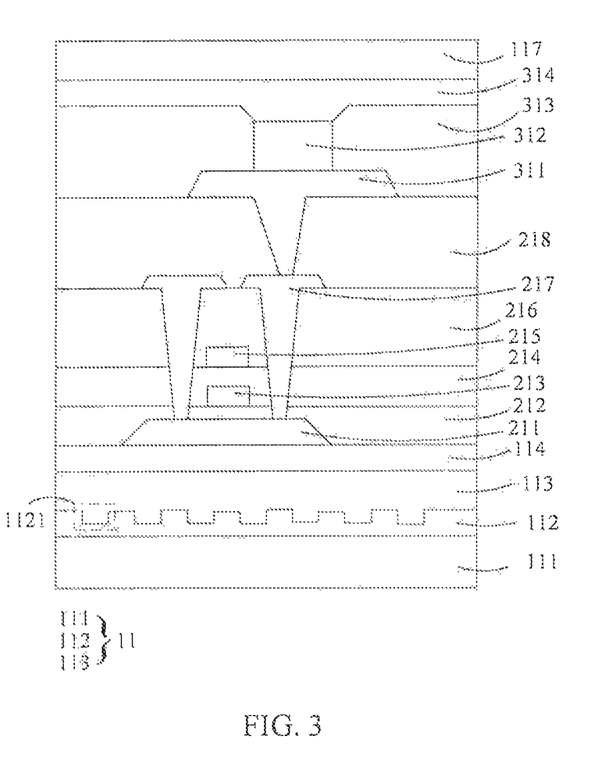
FIG. 3 is a second schematic diagram of the OLED display panel according to one embodiment of the present disclosure.

In one embodiment, as shown in FIG. 3, one embodiment of the present disclosure provides the OLED display panel. The OLED display panel includes a substrate 11, a second barrier layer 114, a driving circuit layer, a light-emitting function layer, and an encapsulation layer 117, the substrate 11 includes a first flexible layer 111, a first barrier layer 112, and a second flexible layer 113, the driving circuit layer includes an active layer 211, a first gate insulating layer 212, a first metal layer 213, a second gate insulating layer 214, a second metal layer 215, an interlayer insulating layer 216, a source and drain layer 217, and a planarization layer 218 sequentially disposed. The light-emitting functional layer includes a pixel electrode layer 311, a pixel definition layer 313, a luminescent material layer 312, and a common electrode layer 314, the first barrier layer 112 is provided with a groove 1121 and the second flexible layer 113 is filled into the groove 1121. By forming the groove on the first barrier layer and filled the first barrier layer with the second flexible layer, the display panel has better flexibility, and because the first flexible layer and the second flexible layer are not directly connected, the first barrier layer can still prevent invasion of water and oxygen, thereby improving the ability to block water and oxygen.

In one embodiment, a disposing area of the groove corresponds a disposing area of the metal lines, that is, for the disposing area of the metal lines, forming a groove of the first barrier layer corresponding to disposing area of the metal lines, so that further improving the flexibility of OLED to prevent metal line from fracture.

In one embodiment, the first barrier layer is formed with at least one protrusion, the second flexible layer is formed with at least one groove, and the at least one protrusion correspond to the at least one groove. In order to further improve the ability to block water and oxygen of the display panel, the first barrier layer can be formed at least one protrusion, and flatten the at least one protrusion by the at least one groove formed on the second flexible layer. Since the at least one protrusion portion of the first barrier layer is not formed on the entire surface, so that a little affect to the flexibility of the display panel, thereby improving the ability to isolate water and oxygen of the display panel without affecting the flexibility.

In one embodiment, a thickness of the second barrier layer is less than a thickness of the first flexible layer, and the thickness of the second barrier layer is less than the thickness of the second flexible layer. By reducing the thickness of the second barrier layer to make the second barrier layer thinner, so that improving the flexibility of the OLED display panel, thereby preventing the metal line fracture of the driving circuit layer.

In one embodiment, the first barrier layer and the second flexible layer can be further divided into multiple layers, so that block the invading water and oxygen multiple times without increasing the thickness of the substrate, thereby improving the ability to block water and oxygen of the OLED display panel.

One embodiment of the present disclosure provides an OLED display device. The OLED display device includes an OLED display panel. The OLED display panel includes:
  a substrate;
  a second barrier layer disposed on the substrate;
  a driving circuit layer disposed on the second barrier layer;
  a light-emitting functional layer disposed on the driving circuit layer; and
  an encapsulation layer disposed on the light-emitting functional layer;
  wherein the substrate includes a first flexible layer, a first barrier layer, and a second flexible layer, the first barrier layer disposed on the first flexible layer, the second flexible layer disposed on the first barrier layer.

One embodiment of the present disclosure provides an OLED display device. The OLED display device includes an OLED display panel. The OLED display panel including a substrate; a second barrier layer disposed on the substrate; a driving circuit layer disposed on the second barrier layer; a light-emitting function layer disposed on the driving circuit layer; and an encapsulation layer disposed on the light-emitting function layer; wherein the substrate includes a first flexible layer, a first barrier layer, and a second flexible layer, the first barrier layer disposed on the first flexible layer, the second flexible layer disposed on the first barrier layer. By disposing the substrate includes the first flexible layer, the first barrier layer, and the second flexible layer sequentially, the water and oxygen be blocked by the first barrier layer after passing through the first flexible layer, and be blocked by the second barrier layer after passing through the second flexible layer. Therefore, improving the water and oxygen blocking ability of the OLED display panel to solve a technical problem of poor water and oxygen blocking abilities.

In one embodiment, a material of the first flexible layer is the same as a material of the second flexible layer.

In one embodiment, a material of the first flexible layer is different from a material of the second flexible layer.

In one embodiment, a thickness of the second flexible layer is less than a thickness of the first flexible layer.

In one embodiment, a material of the first barrier layer is the same as a material of the second barrier layer.

Figure 4:
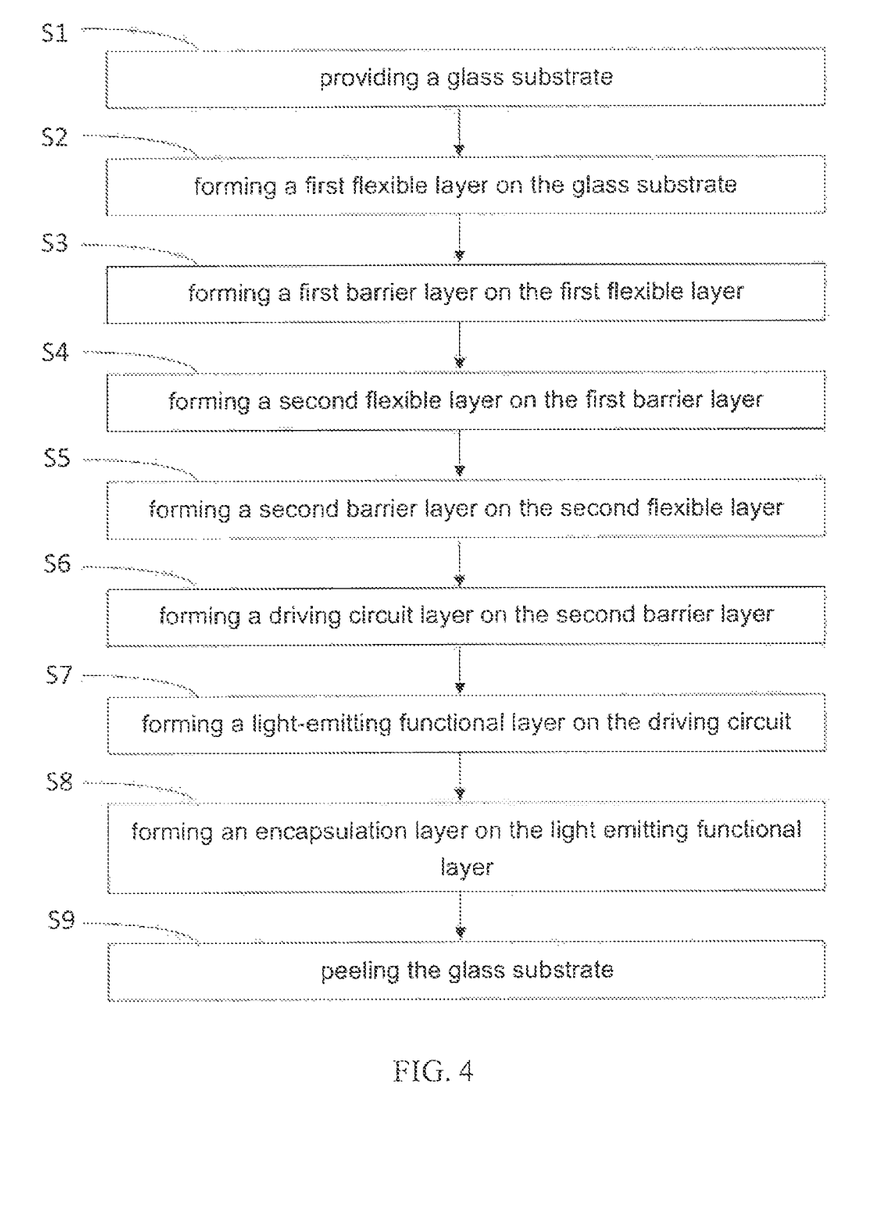
FIG. 4 is a flowchart of a manufacturing method of the OLED display panel according to one embodiment of the present disclosure.

As shown in FIG. 4, one embodiment of the present disclosure provides a manufacturing method of the OLED display panel, comprising:
  S1: providing a glass substrate;
  S2: forming a first flexible layer on the glass substrate;
  S3: forming a first barrier layer on the first flexible layer:
  S4: forming a second flexible layer on the first barrier layer;
  S5: forming a second barrier layer on the second flexible layer;
  S6: forming a driving circuit layer on the second barrier layer;
  S7: forming a light-emitting functional layer on the driving circuit layer;
  S8: forming an encapsulation layer on the light emitting functional layer;
  S9: peeling the glass substrate.

One embodiment of the present disclosure provides a manufacturing method of an OLED display panel. The OLED display panel manufactured by the OLED display panel manufacturing method including a substrate; a second barrier layer disposed on the substrate; a driving circuit layer disposed on the second barrier layer; a light-emitting function layer disposed on the driving circuit layer; and an encapsulation layer disposed on the light-emitting function layer; wherein the substrate includes a first flexible layer, a first barrier layer, and a second flexible layer, the first barrier layer disposed on the first flexible layer, the second flexible layer disposed on the first barrier layer. By disposing the substrate includes the first flexible layer, the first barrier layer, and the second flexible layer sequentially, the water and oxygen be blocked by the first barrier layer after passing through the first flexible layer, and be blocked by the second barrier layer after passing through the second flexible layer. Therefore, improving the water and oxygen blocking ability of the OLED display panel to solve a technical problem of poor water and oxygen blocking abilities.

In one embodiment, the step of peeling the glass substrate includes peeling the peeled substrate using a mechanical peeling technique or a laser peeling technique.

It can be known from the above embodiments:

The present disclosure provide an OLED display panel and a manufacturing method thereof, and an OLED display device, wherein the OLED display panel including a substrate; a second barrier layer disposed on the substrate; a driving circuit layer disposed on the second barrier layer; a light-emitting function layer disposed on the driving circuit layer; and an encapsulation layer disposed on the light-emitting function layer; wherein the substrate includes a first flexible layer, a first barrier layer, and a second flexible layer, the first barrier layer disposed on the first flexible layer, the second flexible layer disposed on the first barrier layer. By disposing the substrate includes the first flexible layer, the first barrier layer, and the second flexible layer sequentially, the water and oxygen be blocked by the first barrier layer after passing through the first flexible layer, and be blocked by the second barrier layer after passing through the second flexible layer. Therefore, improving the water and oxygen blocking ability of the OLED display panel to solve a technical problem of poor water and oxygen blocking abilities.

In summary, although the present disclosure has been disclosed above with preferred embodiments, the above preferred embodiments are not intended to limit the present disclosure. Those skilled in the art can make various modifications and retouching without departing from the spirit and scope of the present disclosure, therefore, the protection scope of the present disclosure is based on the scope defined by the claims.

What is claimed is:

1. An organic light-emitting diode (OLED) display panel, comprising:
   a substrate;
   a second barrier layer disposed on the substrate;
   a driving circuit layer disposed on the second barrier layer;
   a light-emitting functional layer disposed on the driving circuit layer; and
   an encapsulation layer disposed on the light-emitting functional layer;
   wherein the substrate comprises a first flexible layer, a first barrier layer, and a second flexible layer; the first barrier layer is disposed on the first flexible layer and the second flexible layer is disposed on the first barrier layer;
   wherein the first barrier layer is provided with a groove; and
   wherein thicknesses of both the first flexible layer and the second flexible layer are less than 8 micrometers, and wherein the second flexible layer is thinner than the first flexible layer, and wherein the second flexible layer is filled into the groove.

2. The OLED display panel as claimed in claim 1, wherein a material of the first flexible layer is the same as a material of the second flexible layer.

3. The OLED display panel as claimed in claim 1, wherein a material of the first flexible layer is different from a material of the second flexible layer.

4. The OLED display panel as claimed in claim 1, wherein a material of the first flexible layer comprises a polyimide.

5. The OLED display panel as claimed in claim 1, wherein a material of the first barrier layer is the same as a material of the second barrier layer.

6. The OLED display panel as claimed in claim 5, wherein the material of the first barrier layer comprises at least one of a silicon nitride and a silicon oxide.

7. The OLED display panel as claimed in claim 1, wherein a material of the first barrier layer is different from a material of the second barrier layer.

8. The OLED display panel as claimed in claim 1, wherein a thickness of the first barrier layer is less than a thickness of the first flexible layer, and the thickness of the first barrier layer is less than a thickness of the second flexible layer.

9. The OLED display panel as claimed in claim 1, wherein a thickness of the second barrier layer is less than a thickness of the first flexible layer, and the thickness of the second barrier layer is less than a thickness of the second flexible layer.

10. An organic light-emitting diode (OLED) display device comprising an OLED display panel, wherein the OLED display panel comprises:
    a substrate;
    a second barrier layer disposed on the substrate;
    a driving circuit layer disposed on the second barrier layer;
    a light-emitting functional layer disposed on the driving circuit layer; and
    an encapsulation layer disposed on the light-emitting functional layer;
    wherein the substrate comprises a first flexible layer, a first barrier layer, and a second flexible layer; the first barrier layer is disposed on the first flexible layer and the second flexible layer is disposed on the first barrier layer;
    wherein the first barrier layer is provided with a groove; and
    wherein thicknesses of both the first flexible layer and the second flexible layer are less than 8 micrometers, wherein the second flexible layer is thinner than the first flexible layer, and wherein the second flexible layer is filled into the groove.

11. The OLED display device as claimed in claim 10, wherein a material of the first flexible layer is the same as a material of the second flexible layer.

12. The OLED display device as claimed in claim 10, wherein a material of the first flexible layer is different from a material of the second flexible layer.

13. The OLED display device as claimed in claim 10, wherein a material of the first barrier layer is the same as a material of the second barrier layer.

\* \* \* \* \*